US012490396B2

(12) United States Patent
Zhang et al.

(10) Patent No.: US 12,490,396 B2
(45) Date of Patent: Dec. 2, 2025

(54) BOX FRAME AND LED DISPLAY

(71) Applicant: SHENZHEN GLOSHINE TECHNOLOGY CO., LTD., Guangdong (CN)

(72) Inventors: Xianfeng Zhang, Guangdong (CN); Yongjun Zhang, Guangdong (CN); Guoqiang Li, Guangdong (CN); Zhiqiang Gao, Guangdong (CN); Guangfeng Liu, Guangdong (CN)

(73) Assignee: SHENZHEN GLOSHINE TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 18/270,893

(22) PCT Filed: Jun. 15, 2023

(86) PCT No.: PCT/CN2023/100472
§ 371 (c)(1),
(2) Date: Jul. 5, 2023

(87) PCT Pub. No.: WO2024/032146
PCT Pub. Date: Feb. 15, 2024

(65) Prior Publication Data

US 2024/0381554 A1 Nov. 14, 2024

(30) Foreign Application Priority Data

Aug. 11, 2022 (CN) ........................ 202210963318.4

(51) Int. Cl.
*H05K 5/02* (2006.01)
*E04B 5/46* (2006.01)
(Continued)

(52) U.S. Cl.
CPC ............ *H05K 5/0247* (2013.01); *E04B 5/46* (2013.01); *E04F 15/02* (2013.01); *G09F 9/3026* (2013.01)

(58) Field of Classification Search
CPC ....... G09F 9/3026; H05K 5/0247; E04B 5/46; E04F 15/02; G09G 2300/026
See application file for complete search history.

(56) References Cited

U.S. PATENT DOCUMENTS 11,382,222 B2 * 7/2022 Hao ...................... G09F 9/3026
2021/0312839 A1 10/2021 Cheng et al.

FOREIGN PATENT DOCUMENTS

CN 107316571 A * 11/2017
CN 107481625 A 12/2017
(Continued)

*Primary Examiner* — James Wu

(57) ABSTRACT

Provided are a box frame and an LED display. The box frame comprises a frame border for installing an LED module, the frame border comprises a plurality of connecting seats and a plurality of frames, each connecting seat connects two adjacent frames, the connecting seat and the frame are alternately connected to form a closed structure; and the frame comprises an inner plate, an outer plate, a partition, a first reinforcing structure and a second reinforcing structure, the inner plate and the outer plate are arranged at intervals, the partition is connected between the inner plate and the outer plate, so as to divide space between the inner plate and the outer plate into a first groove and a second groove, the first reinforcing structure is arranged in the first groove and the second reinforcing structure is arranged in the second groove.

10 Claims, 9 Drawing Sheets

(51) Int. Cl.
*E04F 15/02* (2006.01)
*G09F 9/302* (2006.01)

(56) References Cited

FOREIGN PATENT DOCUMENTS

| | | | |
|---|---|---|---|
| CN | 207118116 U | | 3/2018 |
| CN | 207781100 U | | 8/2018 |
| CN | 209312363 U | | 8/2019 |
| CN | 212847495 U | | 3/2021 |
| CN | 213716390 U | | 7/2021 |
| CN | 213988122 U | * | 8/2021 |
| CN | 215830886 U | | 2/2022 |
| CN | 215991502 U | | 3/2022 |
| CN | 218299310 U | | 1/2023 |

* cited by examiner

BOX FRAME AND LED DISPLAY

TECHNICAL FIELD

The application belongs to the technical field of display screens, in particular to a box frame and an LED display.

BACKGROUND

Box frame is an important component of LED display screen, which not only supports and holds the LED module, but also accommodates the power box of LED display power supply adapter and control circuit board.

The common box frame is usually made up of multiple load-bearing structures, the overall structure is relatively heavy and the frame strength is low. When the LED display is lifted for installation or used as a floor tile screen, the lack of strength of the box frame is likely to cause the deformation of the box frame, especially when it is used as a floor tile screen, the lack of strength of the box frame may cause safety accidents.

SUMMARY

Aiming at the technical problem of low strength of the existing box frame, the application provides a box frame and an LED display.

In one respect, an embodiment of the present application provides a box frame, including a frame border for installing an LED module, wherein the frame border includes a plurality of connecting seats and a plurality of frames, each connecting seat connects two adjacent frames, the connecting seat and the frame are alternately connected to form a closed structure; and the frame includes an inner plate, an outer plate, a partition, a first reinforcing structure and a second reinforcing structure, the inner plate and the outer plate are arranged at intervals, the partition is connected between the inner plate and the outer plate, so as to divide space between the inner plate and the outer plate into a first groove and a second groove, the first reinforcing structure is arranged in the first groove and the second reinforcing structure is arranged in the second groove.

Optionally, the inner plate and the outer plate are arranged in parallel, and the partition is vertically connected between the inner plate and the outer plate.

Optionally, the first reinforcing structure includes a first connecting plate, a plurality of first reinforcing ribs and a plurality of second reinforcing ribs, the first connecting plate is arranged between the inner plate and the outer plate of the first groove, and a plurality of the first reinforcing ribs are arranged between the inner plate and the first connecting plate at intervals, a plurality of the second reinforcing ribs are arranged between the outer plate and the first connecting plate at intervals; and the second reinforcing structure includes a second connecting plate, a plurality of third reinforcing ribs and a plurality of third reinforcing ribs, the third connecting plate is arranged between the inner plate and the outer plate of the third groove, and a plurality of the third reinforcing ribs are arranged between the inner plate and the second connecting plate at intervals, a plurality of the fourth reinforcing ribs are arranged between the outer plate and the second connecting plate at intervals.

Optionally, the first reinforcing rib and the second reinforcing rib are staggered, and the third reinforcing rib and the fourth reinforcing rib are staggered.

Optionally, a plurality of leakage holes are arranged on the partition, the leakage hole communicates the first groove and the second groove, and the leakage hole is arranged between two adjacent first reinforcing ribs and two adjacent second reinforcing ribs.

Optionally, the box frame further includes a box adapter plate, a box sealing plate and a sealing plate connector, the sealing plate connector is connected in the frame border, the sealing plate connector is provided with an accommodation groove for accommodating the box adapter plate, the box sealing plate is connected to a sealing plate connector and encapsulated in the accommodation groove, and the box sealing plate is used for connecting a power box.

Optionally, the box adapter plate is provided with a first female header and a first pin header, the sealing plate connector is provided with a first insertion hole for the first pin header to pass through, and the first insertion hole is communicated with the accommodation groove, the box sealing plate is provided with a second insertion hole for the first female header to pass through; and the first pin header is used to connect the second female header on the LED module, and the first female header is used to connect the second pin header in the power box, so as to electrically connect the LED module and the power box via the box adapter plate.

Optionally, the box frame further includes a horizontal connector and a longitudinal connector, the horizontal connector and the longitudinal connector are cross-connected inside the frame border, so as to divide an interior of the frame border into a plurality of module installation areas, the module installation areas are not communicated with each other and used for installing the LED module.

Optionally, the connecting seat includes a first connecting seat and a second connecting seat, and the first connecting seat is arranged at a corner of the frame border, two adjacent frames connected by the first connecting seat are perpendicular to each other, and two frames connected by the second connecting seat have a same extension direction; and the first connecting seat is provided with a positioning hole for positioning the box frame in a first installation mode, and the second connecting seat is provided with a mounting hole for fixedly connecting the box frame in a second installation mode.

In another respect, an embodiment of the present application provides an LED display, including a box frame, a power box and a plurality of LED modules, the power box is installed at one side of the box frame, and the plurality of LED modules are installed at another side of the box frame.

For the box frame provided by the embodiments of the application, the partition can be supported between the inner plate and the outer plate, and separate the first groove from the second groove. With the first reinforcing structure and the second reinforcing structure, the bearing capacity and strength of the box frame can be enhanced, the internal stress of the box frame can be eliminated, the deformation and shrinkage cavity can be alleviated, the toughness can be increased, and the deformation of the box frame caused by insufficient strength can be avoided.

Figure 1:
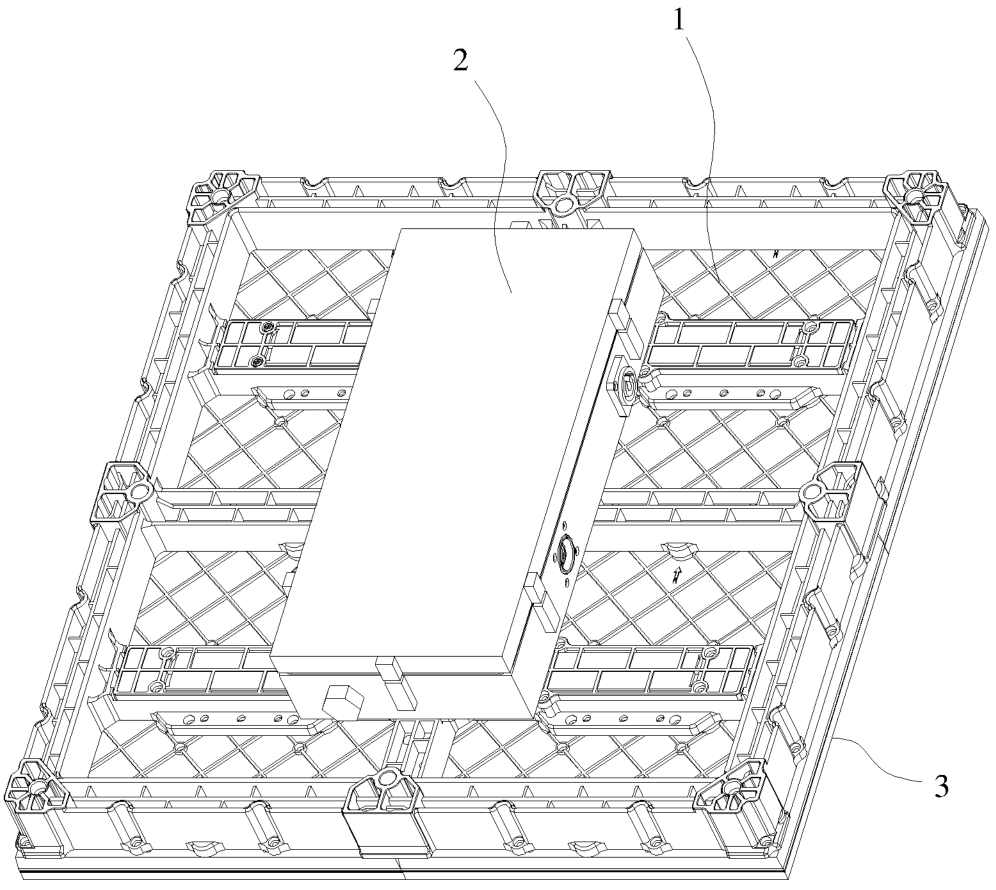
FIG. 1 is a schematic diagram of a box frame provided by an embodiment of the present application.

Reference signs in the drawings are as follows:

1. Box frame;

11. Frame border; 111. First connecting seat; 1111. Positioning hole; 1112. Seven connecting hole; 1113. Second module positioning hole; 112. Second connecting seat; 1121. Mounting hole; 1122. Eighth connecting hole; 1123. Third module positioning hole; 113. Frame; 1131. Inner plate; 1132. Outer plate; 1133. Partition; 11331. Leakage hole; 1134. First groove; 1135. Second groove; 1136. First reinforcing structure; 11361. First connecting plate; 11362. First reinforcing rib; 11363. Second reinforcing rib; 1137. Second reinforcing structure; 11371. Second connecting plate; 11372. Third reinforcing rib; 11373. Fourth reinforcing rib; 114. Fourth connecting hole;

12. Box adapter plate; 121. First female header; 122. First pin header;

13. Box sealing plate; 131. First plate piece; 1311. First connecting hole; 132. Second plate piece; 1321. Third connecting hole; 1322. Power box connecting hole; 1323. Second insertion hole; 133. Third plate piece; 1331. Second connecting hole;

14. Sealing plate connector; 141. First butt-joint hole; 142. Second butt-joint hole; 143. Third butt-joint hole; 144. Accommodation groove; 145. First insertion hole; 146. Ninth connecting hole;

15. Horizontal connector; 151. Fifth connecting hole; 152. First module positioning hole;

16. Longitudinal connector; 161. Sixth connecting hole;

17. Magnet mounting hole; 171. Magnet;

2. Power box; 21. Box body; 22. Box cover; 23. Power supply; 24. Power box adapter; 25. Second pin header;

3. LED module; 31. Iron sheet; 32. Positioning column; 33. Fixing hole; 34. Second female header.

DETAILED DESCRIPTION OF PREFERRED EMBODIMENTS

In order to make the to-be-solved technical problems, technical solutions and beneficial effects of the present application clearer, the present application will be described in further detail below with reference to the drawings and embodiments. It should be understood that the embodiments described here are only used to illustrate the technical solution of the present application, rather than limit it.

Figure 2:
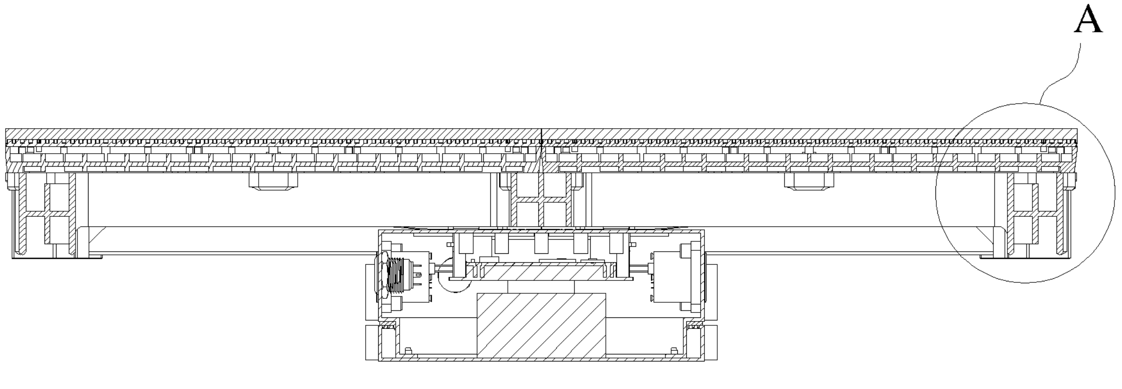
FIG. 2 is a schematic sectional view of a box frame provided by an embodiment of the present application.
Figure 3:
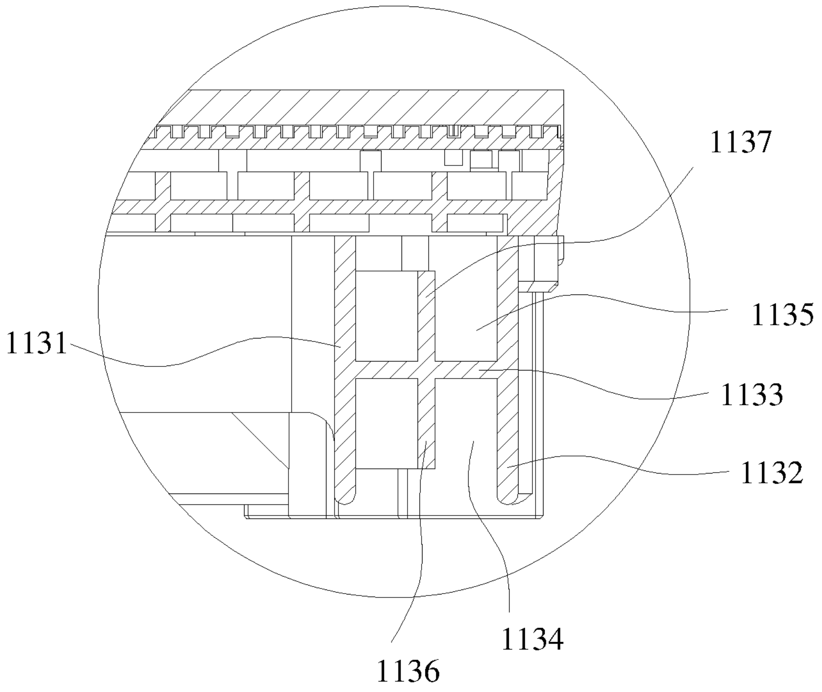
FIG. 3 is an enlarged schematic view of A in FIG. 2.
Figure 4:
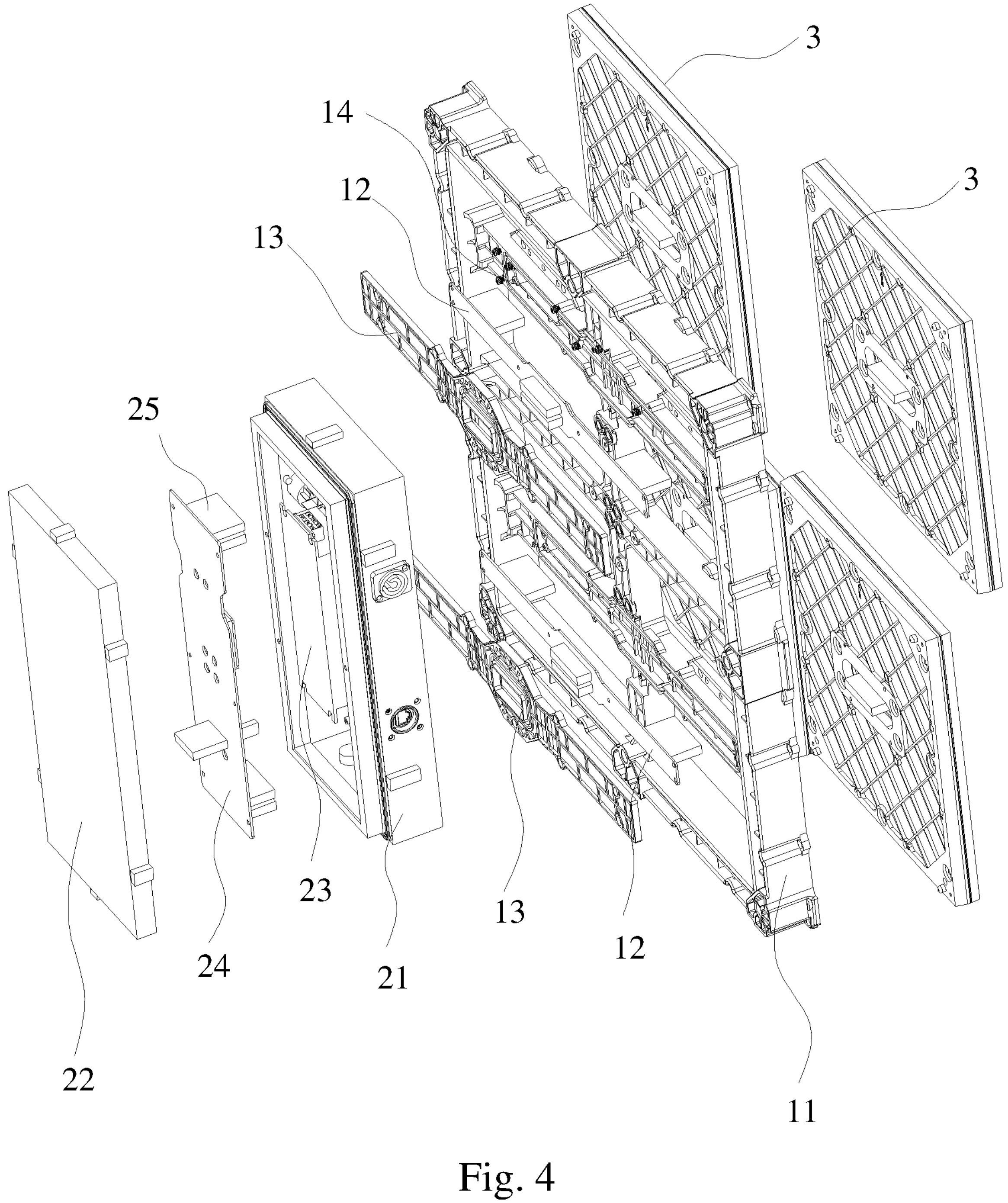
FIG. 4 is an exploded view of a box frame provided by an embodiment of the present application.
Figure 5:
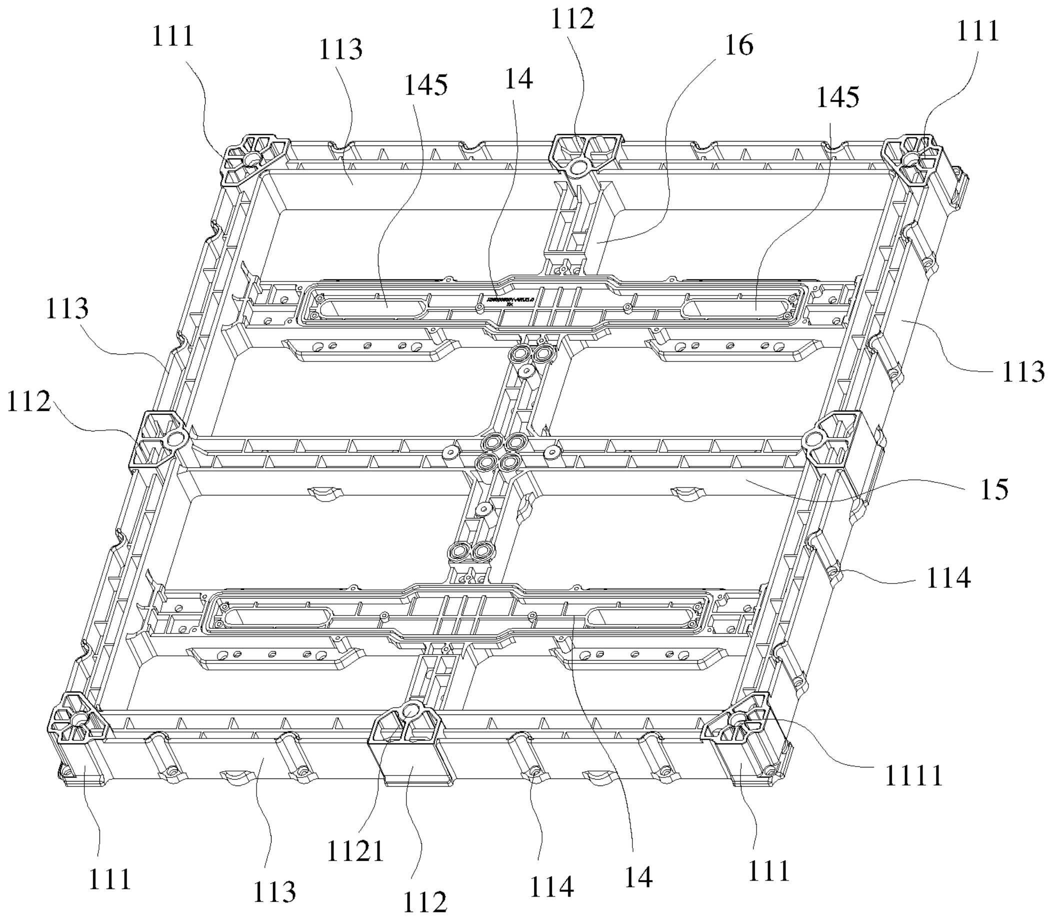
FIG. 5 is a schematic diagram of a frame border provided by an embodiment of the present application.
Figure 6:
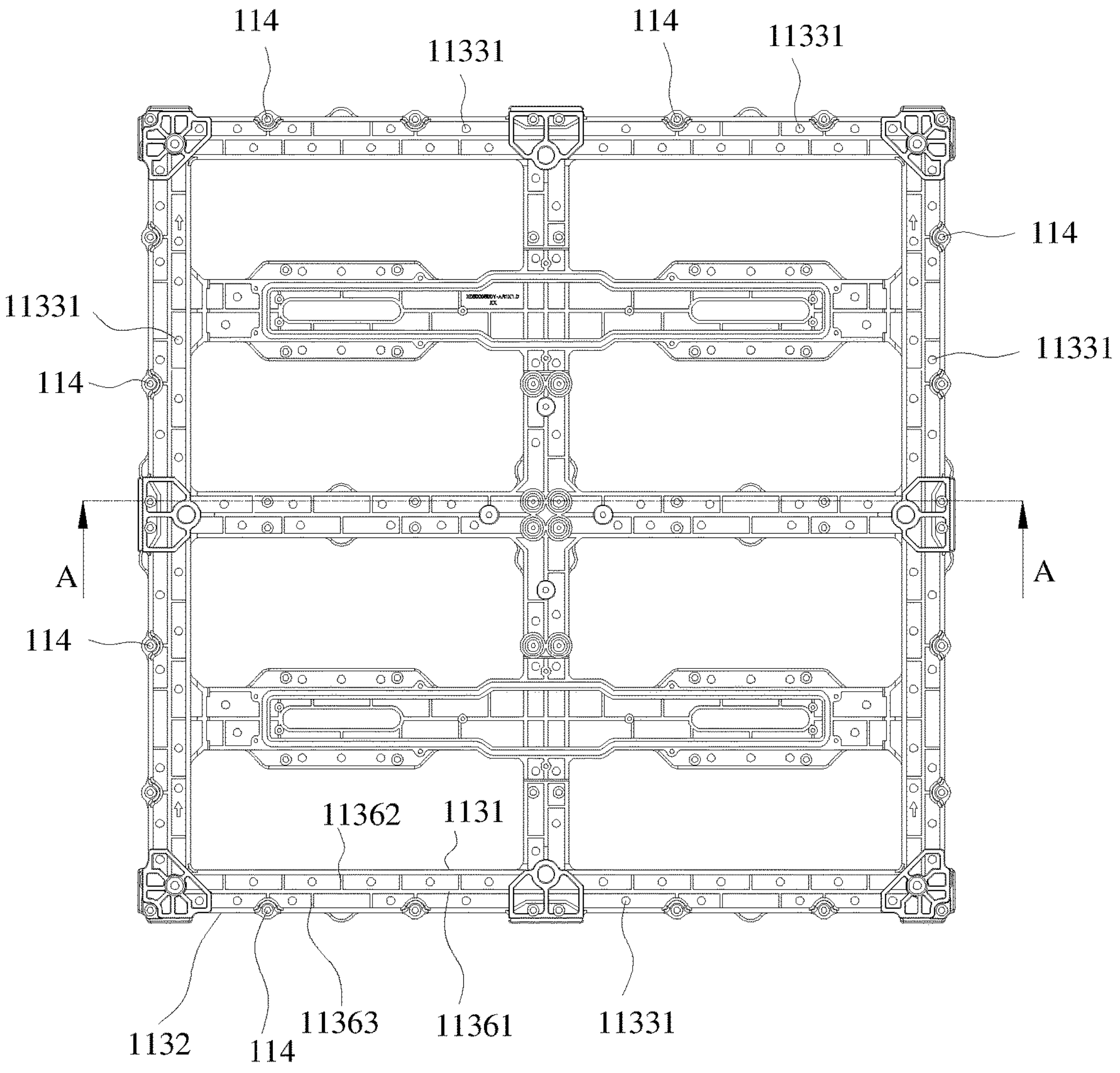
FIG. 6 is a schematic plan view of a frame border provided by an embodiment of the present application.
Figure 7:
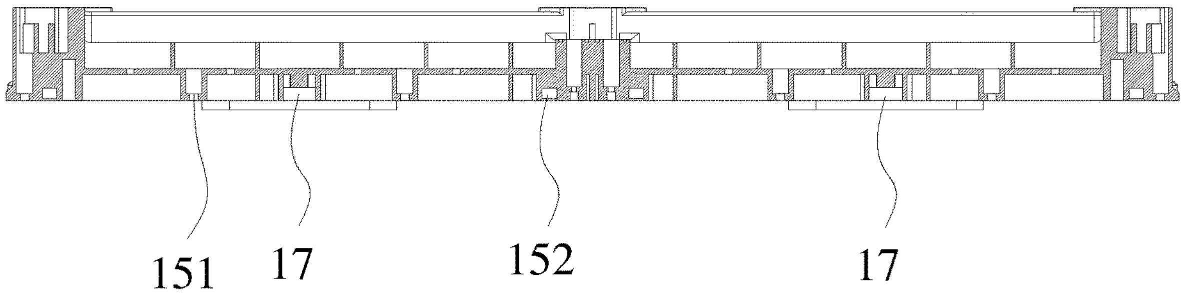
FIG. 7 is a schematic view of the section taken along the line A-A in FIG. 6.
Figure 8:
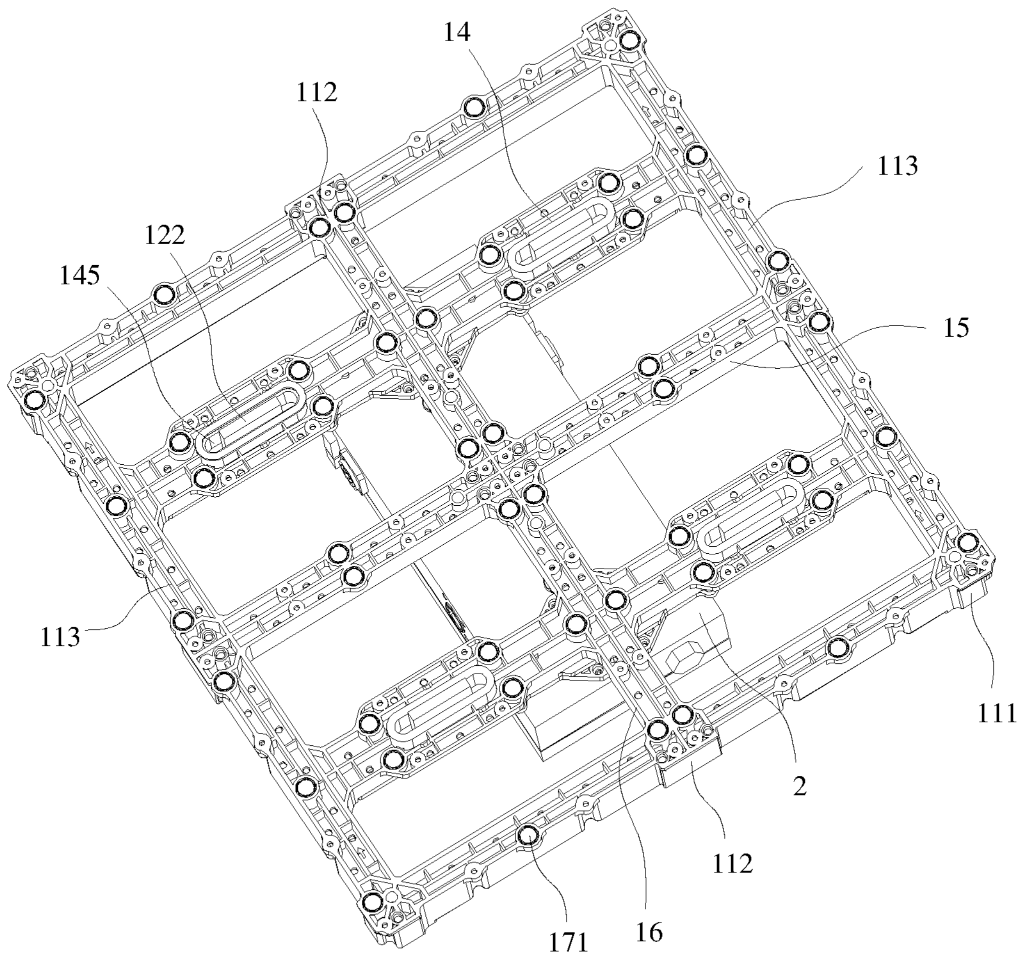
FIG. 8 is another schematic diagram of a frame border provided by an embodiment of the present application.
Figure 9:
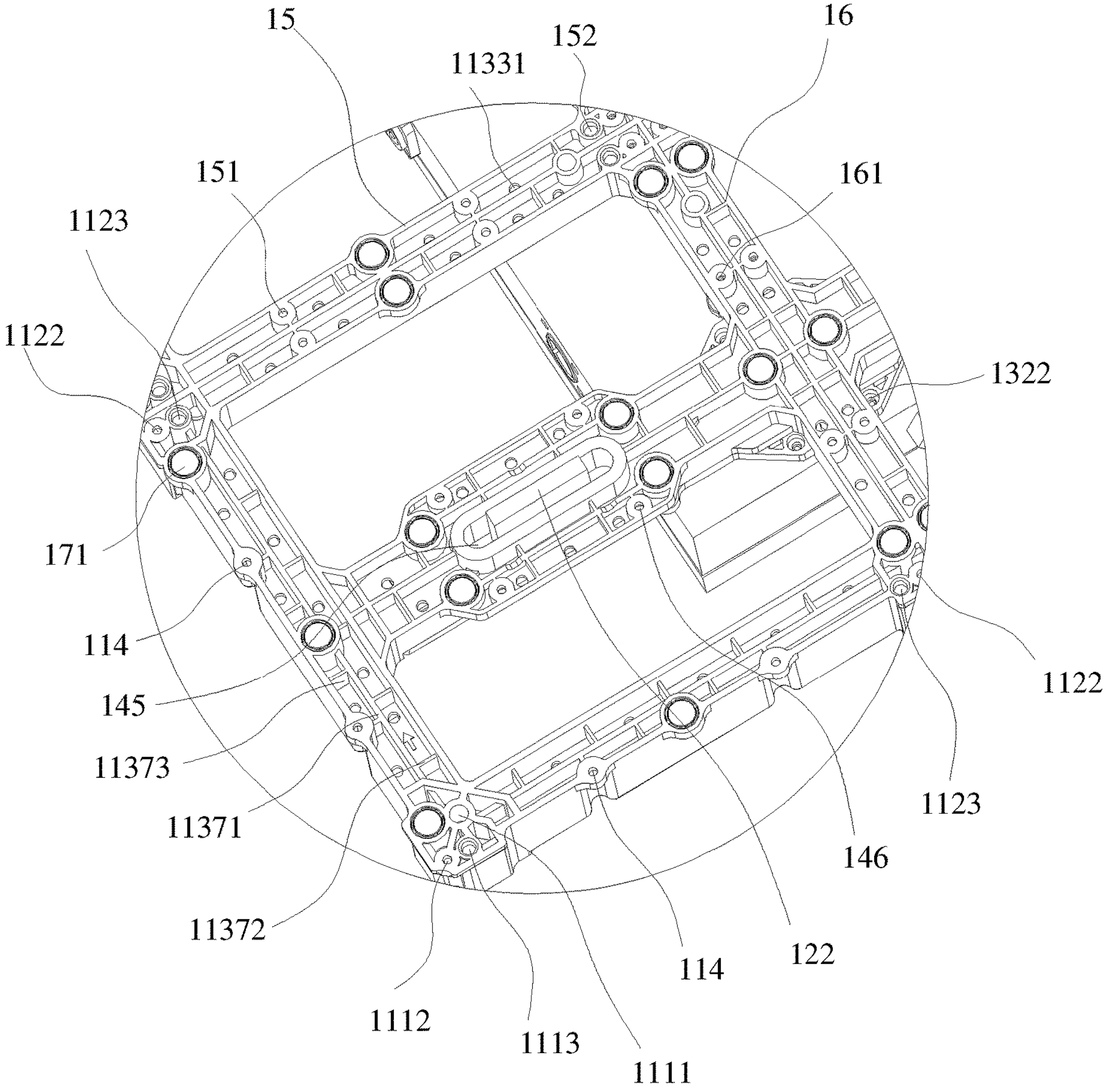
FIG. 9 is a partial schematic diagram of a frame border provided by an embodiment of the present application.
Figure 10:
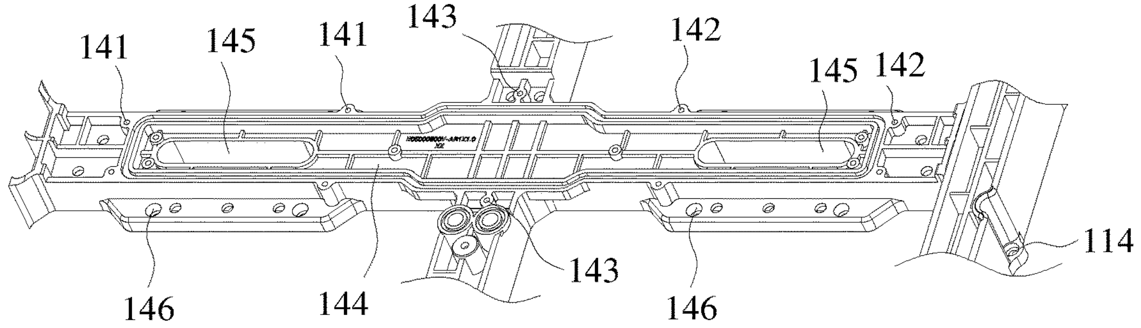
FIG. 10 is a schematic diagram of a sealing plate connector provided by an embodiment of the present application.
Figure 11:
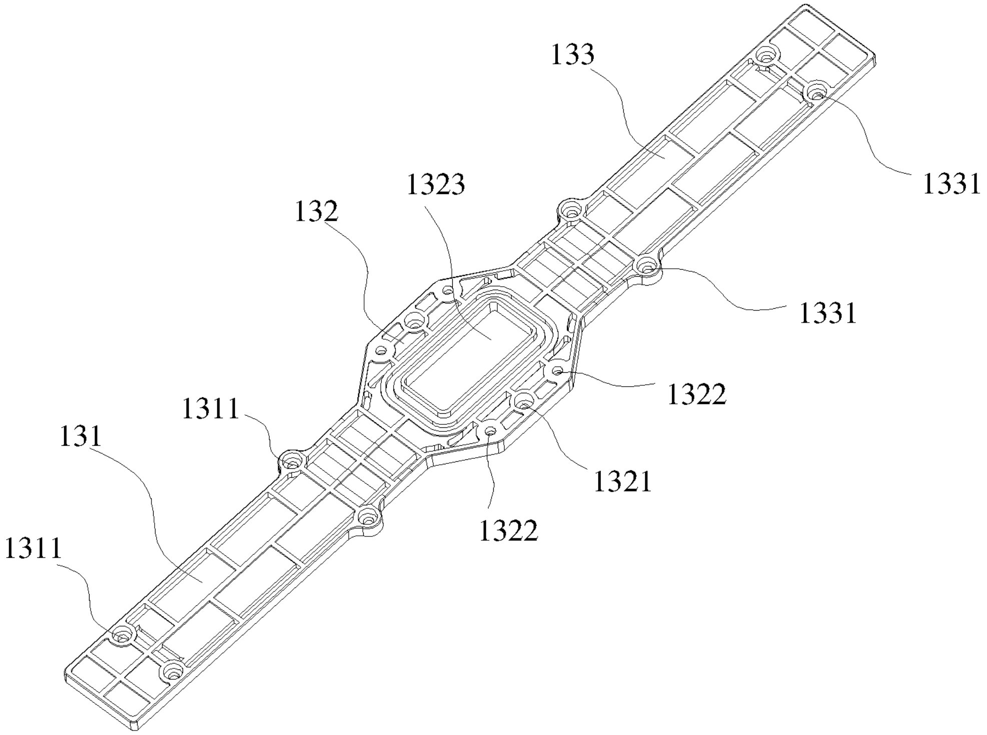
FIG. 11 is a schematic diagram of a box sealing plate provided by an embodiment of the present application.
Figure 12:
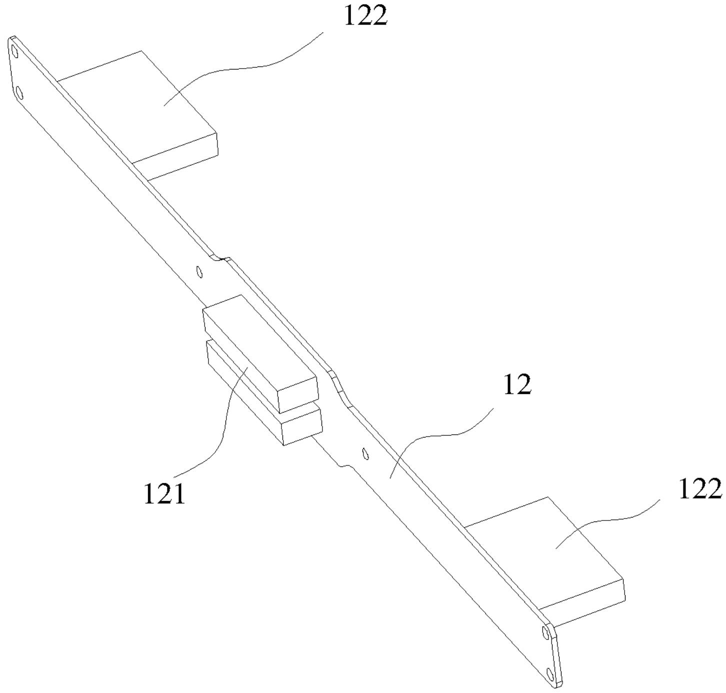
FIG. 12 is a schematic diagram of a box adapter plate provided by an embodiment of the present application.
Figure 13:
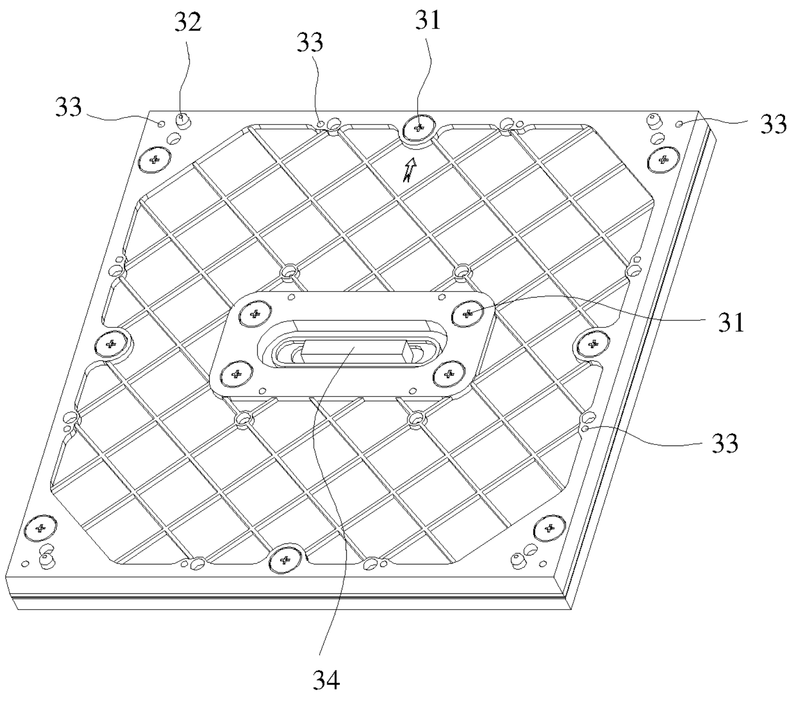
FIG. 13 is a schematic diagram of an LED module provided by an embodiment of the present application.

As shown in FIGS. 1 to 13, an embodiment of the present application provides a box frame 1, includes a frame border 11 for installing an LED module 3. the frame border 11 includes a plurality of connecting seats and a plurality of frames 113, each connecting seat connects two adjacent frames 113. Among the plurality of frames 113, the first frame 113 and the last frame 113 are connected to the same connecting seat, and a closed structure is formed by alternately connecting the plurality of connecting seats and the plurality of frames 113.

The frame 113 includes an inner plate 1131, an outer plate 1132, a partition 1133, a first reinforcing structure 1136 and a second reinforcing structure 1137, the inner plate 1131 and the outer plate 1132 are arranged at intervals, the partition 1133 is connected between the inner plate 1131 and the outer plate 1132, so as to divide space between the inner plate 1131 and the outer plate 1132 into a first groove 1134 and a second groove 1135. That is, the partition 1133, the part of inner plate 1131 on one side of the partition 1133, and the part of outer plate 1132 on one side of the partition 1133 are enclosed to form the first groove 1134. The partition 1133, the part of inner plate 1131 on the other side of the partition 1133, and the part of the outer plate 1132 on the other side of the partition 1133 are enclosed to form the second groove 1135. The first reinforcing structure 1136 is arranged in the first groove 1134, and the second reinforcing structure 1137 is arranged in the second groove 1135, so as to support the inner plate 1131 and the outer plate 1132.

For the box frame 1 provided by the embodiments of the application, the partition 1133 can be supported between the inner plate 1131 and the outer plate 1132, and separate the first groove 1134 from the second groove 1135. With the first reinforcing structure 1136 and the second reinforcing structure 1137, the bearing capacity and strength of the box frame can be enhanced, the internal stress of the box frame can be eliminated, the deformation and shrinkage cavity can be alleviated, the toughness can be increased, and the deformation of the box frame 1 caused by insufficient strength can be avoided.

In an embodiment, the frame border 11 is a square closed frame, and the material of the frame border 11 is aluminum alloy or magnesium alloy.

In an embodiment, the inner plate 1131 and the outer plate 1132 are arranged in parallel, the partition 1133 is vertically connected between the inner plate 1131 and the outer plate 1132, the cross-sectional of the frame 113 is H-shaped, and it has good bending resistance. Preferably, the two ends of the partition 1133 are respectively connected to the middle of the inner plate 1131 and the middle of the outer plate 1132. That is, the first groove 1134 and the second groove 1135 have the same size, which can ensure the uniform stress of the frame 113.

In an embodiment, the first reinforcing structure 1136 includes a first connecting plate 11361, a plurality of first reinforcing ribs 11362 and a plurality of second reinforcing ribs 11363. The first connecting plate 11361 is arranged between the inner plate 1131 and the outer plate 1132 of the first groove 1134, the first connecting plate 11361 is arranged along the extending direction of the first groove 1134, and the length of the first connecting plate 11361 is the same as that of the first groove 1134. A plurality of the first reinforcing ribs 11362 are arranged between the inner plate 1131 and the first connecting plate 11361 at intervals, a plurality of the second reinforcing ribs 11363 are arranged between the outer plate 1132 and the first connecting plate 11361 at intervals. The inner plate 1131 and the outer plate 1132 can be further supported by the first compensating rib 11362 and the second compensating rib 11363, and the deformation can be reduced.

In an embodiment, the first reinforcing structure 1137 includes a second connecting plate 11371, a plurality of third reinforcing rib 11372 and a plurality of fourth reinforcing rib 11373. The second connecting plate 11371 is arranged between the inner plate 1131 and the outer plate 1132 of the second groove 1135, the second connecting plate 11371 is arranged along the extending direction of the second groove 1135, and the length of the second connecting plate 11371 is the same as that of the second groove 1135. A plurality of the third reinforcing rib 11372 are arranged between the inner plate 1131 and the second connecting plate 11371 at intervals, a plurality of the fourth reinforcing rib 11373 are arranged between the outer plate 1132 and the second connecting plate 11371 at intervals. The inner plate 1131 and the outer plate 1132 can be further supported by the third reinforcing rib 11372 and the fourth reinforcing rib 11373, and the deformation can be reduced.

In an embodiment, the first reinforcing rib 11362 and the second reinforcing rib 11363 are staggered, the third reinforcing rib 11372 and the fourth reinforcing rib 11373 are staggered. In this way, the number of reinforcing ribs may be reduced, and the stress of the frame 113 may be dispersed, so that the stress of the frame 113 is uniform, internal stress is eliminated, and deformation is reduced.

In an embodiment, a plurality of leakage holes 11331 are arranged on the partition 1133, and the leakage hole 11331 communicates with the first groove 1134 and the second groove 1135. The leakage hole 11331 is arranged between two adjacent first reinforcing ribs 11362 and two adjacent second reinforcing ribs 11363. Between the first connecting plate 11361 and the inner plate 1131, the leakage hole 11331 and the first reinforcing rib 11362 are alternately arranged. Between the first connecting plate 11361 and the outer plate 1132, the leakage holes 11331 and the second reinforcing rib 11363 are alternately arranged. By arranging a plurality of the leakage holes 11331, water would not accumulate at any position of the frame 113, it can be discharged in time and the weight of the frame 113 can be reduced.

In an embodiment, the box frame 1 further includes a box adapter plate 12, a box scaling plate 13 and a sealing plate connector 14, and the sealing plate connector 14 is connected in the frame border 11. The sealing plate connector 14 is provided with an accommodation groove 144 for accommodating the box adapter plate 12, and the outline of the accommodation groove 144 is the same as that of the box adapter plate 12. The box adapter plate 12 is fixedly connected in the accommodation groove 144 by screws and or connectors. The box sealing plate 13 is connected to the sealing plate connector 14 and the box adapter plate 12 is encapsulated in the accommodation groove 144. The box adapter plate 12 does not protrude from the accommodation groove 144, and the power box 2 is connected to the box sealing plate 13.

In an embodiment, the box sealing plate 13 includes a first plate piece 131, a second plate piece 132 and a third plate piece 133. The first plate piece 131 and the third plate piece 133 are symmetrically arranged on both sides of the first plate piece 131, and a plurality of first connecting holes 1311 are arranged on the first plate piece 131. The third plate piece 133 is provided with a plurality of second connecting holes 1331, and the second plate piece 132 is provided with a plurality of third connecting holes 1321 and a plurality of power box connecting holes 1322. The sealing plate connector 14 is provided with a first butt-joint hole 141 corresponding to the position of the first connecting hole 1311, a second butt-joint hole 142 corresponding to the position of the second connecting hole 1331 and a third butt-joint hole 143 corresponding to the position of the third connecting hole 1321. The first connecting hole 1311 and the first butt-joint hole 141 are connected by bolts or screws, the second connecting hole 1331 and the second butt-joint hole 142 are connected by bolts or screws, and the third connecting hole 1321 and the third butt-joint hole 143 are connected by bolts or screws, thereby fixedly connecting the box sealing plate 13 to the sealing plate connector 14. The power box connecting hole 1322 is penetrated with a screw to fixedly connect the power box 2 with the box scaling plate 13.

In an embodiment, the box adapter plate 12 is provided with a first female header 121 and a first pin header 122, the first pin header 122 is arranged on the side of the box adapter plate 12 facing the sealing plate connector 14, the first female header 121 is arranged on the side of the box adapter plate 12 away from the sealing plate connector 14. The box adapter plate 12 can realize the electrical connection between the first female header 121 and the first pin header 122. The sealing plate connector 14 is provided with a first insertion hole 145 for the first pin header 122 to pass through, and the opening of the first insertion hole 145 is arranged in the accommodation groove 144. And, the first insertion hole 145 penetrates the sealing plate connector 14, the first insertion hole 145 is communicated with the accommodation groove 144. The first pin header 122 passes through the sealing plate connector 14 and is connected to the second female header 34 on the LED module 3. The box sealing plate 13 is provided with a second insertion hole 1323 for the first female header 121 to pass through, and the second insertion hole 1323 is provided on the second plate piece 132. The second insertion hole 1323 passes through the box sealing plate 13, and the first female header 121 passes through the box sealing plate 13 and is connected with the second pin header 25 in the power box 2, so as to electrically connect the LED module 3 and the power box 2 via the box adapter plate 12.

Specifically, the first pin header 122 is inserted into the second female header 34, and the second pin header 25 is inserted into the first female header 121. The power box 2 passes through the second pin header 25, the first female header 121, the box adapter plate 12, the first pin header 122 and the second female header 34 in turn, and then is electrically connected to the LED module 3.

In an embodiment, the power box 2 includes a box body 21, a box cover 22, a power supply 23 and a power box adapter 24, the box cover 22 is installed on the box cover 22, the power supply 23 and the power box adapter 24 are arranged inside the box body 21, and the box body 21 is mounted on the box sealing plate 13 through the plurality of power box connecting holes 1322 on the second plate piece 132. The power box adapter 24 is provided with a second pin header 25, and the first female header 121 on the box adapter plate 12 is connected with the second pin header 25, so that the box adapter plate 12 is electrically connected with the power box adapter 24.

In an embodiment, the box frame 1 further includes a horizontal connector 15 and a longitudinal connector 16, and the numbers of the horizontal connector 15 and the longitudinal connector 16 are determined according to actual needs. The horizontal connector 15 and the longitudinal connector 16 are cross-connected inside the frame border 11, so as to divide the inside of the frame border 11 into a plurality of module installation areas which are not connected with each other, and the module installation areas are used for installing the LED module 3.

In an embodiment, the horizontal connector 15 is provided with one, and the longitudinal connector 16 is provided with one, dividing the frame border 11 into four module installation areas, and four LED module 3 can be installed on one frame border 11.

In an embodiment, the sealing plate connector 14 includes a first sealing plate connector and a second sealing plate connector, the box sealing plate 13 includes a first box sealing plate and a second box sealing plate, and the box adapter plate 12 includes a first box adapter plate and a second box adapter plate. The first box sealing plate is connected to the first sealing plate connector and the first box adapter plate is encapsulated in the accommodation groove 144 of the first box sealing plate. The second box sealing plate is connected to the second sealing plate connector and the second box adapter plate is encapsulated in the accommodation groove 144 of the second box sealing plate. The box body 21 of the power box 2 is connected to the first box sealing plate and the second box sealing plate.

In an embodiment, the first sealing plate connector and the second sealing plate connector are respectively arranged at two sides of the horizontal connector 15. The thickness of the first scaling plate connector and the second sealing plate connector are both smaller than that of the horizontal connector 15, the total thickness of the first sealing plate connector and the first box sealing plate is the same as that of the horizontal connector 15, and the total thickness of the second sealing plate connector and the second box sealing plate is the same as that of the horizontal connector 15.

When four LED modules 3 are connected to the power box 2, the first box adapter plate can electrically connect two LED modules 3, and the second box adapter plate can electrically connect the other two LED modules 3. Further, the first sealing plate connector is provided with two first insertion holes 145, and the first box adapter plate is provided with two first pin headers 122. Each of the first pin headers 122 is inserted into the corresponding first insertion hole 145, and each of the first pin headers 122 is connected to the second female header 34 on one LED module 3, so that two LED modules 3 can be electrically connected at the same time through the first box adapter plate. Similarly, the second box adapter plate can electrically connect two other LED module 3 at the same time.

The power box adapter 24 is provided with two second pin headers 25, the first female header 121 on the first box adapter plate passes through the second insertion hole 1323 on the first box sealing plate and is connected with one of the second pin headers 25. The first female header 121 on the second box adapter plate passes through the second insertion hole 1323 on the second box sealing plate and is connected with another second pin header 25. The first box adapter plate and the second box adapter plate can be electrically connected through the power box adapter 24 at the same time, so that the connection of a plurality of LED modules 3 and the power box 2 can be realized.

In this embodiment, with the box adapter plate 12, which can be electrically connected with at least one LED module 3, and then is electrically connected with the power box adapter 24 through the box adapter plate 12, thus the electrical connection between a plurality of LED modules 3 and the power box 2 is indirectly realized. Compared with the existing power box 2 which is provided with larger size for the purpose to involve a plurality of LED modules 3 when the modules are directly connected with the power box 2. In this embodiment, the power box 2 is smaller in size, which can greatly reduce the weight and reduce the bearing burden of the power box 2 on the box frame 1.

In an embodiment, the connecting seat includes a first connecting seat 111 and a second connecting seat 112, and the first connecting seat 111 is arranged at the corner of the frame border 11. The adjacent two frames 113 connected by the first connecting seat 111 are perpendicular to each other, and the inner plates 1131 of the adjacent two frames 113 of the first connecting seat 111 are butted. The extension directions of two frames 113 connected by the second connecting seat 112 are the same, and the inner plates 1131 of two adjacent frames 113 of the second connecting seat 112 are located on the same straight line, so that the inner plates 1131 of the plurality of frames 113 are enclosed to form a closed structure.

In an embodiment, the first connecting seat 111 is provided with a positioning hole 1111 for positioning the box frame 1 in a first installation mode, and the second connecting seat 112 is provided with a mounting hole 1121 for fixedly connecting the box frame 1 in a second installation mode.

After the LED module 3 and the power box 2 are installed on the box frame 1 to form an LED display, the first installation mode is that when the LED display screen is used as a floor tile display screen, a positioning rod is arranged on the floor tile base, and the positioning rod is inserted into the positioning hole 1111 of the first connecting seat 111, so that the rapid positioning and installation of the LED display can be realized through the positioning hole 1111.

The second installation mode is that when the LED display screen is used in other occasions, it is connected in the mounting hole 1121 through bolts and threads, thus the display screen is fixedly connected. With the positioning hole 1111 and the mounting hole 1121, the application scope of the box frame 1 can be expanded to meet various requirements.

In addition, the present application provides an LED display, including a box frame 1, a power box 2 and a plurality of LED modules 3, the power box 2 is installed at one side of the box frame 1, and the plurality of LED modules 3 are installed at another side of the box frame 1.

In an embodiment, a plurality of magnet mounting holes 17 are arranged on the box frame 1, and the magnet 171 is embedded in the magnet mounting holes 17. The LED module 3 is provided with a plurality of iron sheets 31, and the LED module 3 is adsorbed on the box frame 1 through the magnetic attraction between the iron sheet and the magnet 171.

In an embodiment, the plurality of frames 113 are provided with a plurality of fourth connecting holes 114, and the fourth connecting holes 114 are arranged outside the outer plate 1132. The outer plate 1132 protrudes toward the inner plate 1131 at the position where the fourth connecting hole 114 is arranged, and is used for avoidance when installing screws in the fourth connecting hole 114.

The horizontal connector 15 is provided with a plurality of fifth connecting holes 151 and a plurality of first module positioning holes 152, the longitudinal connector 16 is provided with a plurality of sixth connecting holes 161, the first connecting seat 111 is provided with a seven connecting hole 1112 and a second module positioning hole 1113, the second connecting seat 112 is provided with an eighth connecting hole 1122 and a third module positioning hole 1123, and the sealing plate connector 14 is provided with a plurality of ninth connecting holes 146.

The LED module 3 is provided with a plurality of positioning columns 32 and a plurality of fixing holes 33. In a module installation area, after inserting the positioning column 32 in the corresponding position in the first module positioning hole 152, the second module positioning hole 1113 and the third module positioning hole 1123, the positioning of the LED module 3 is realized. And at the same time, the LED module 3 is adsorbed on the box frame 1 through the magnetic attraction between the iron sheet and the magnet 171, so that the fixed installation can be proceeded later.

The fifth connecting hole 151, sixth connecting hole 161, seven connecting hole 1112, eighth connecting hole 1122 and ninth connecting hole 146 are connected with the fixing holes 33 at corresponding positions by bolts, thereby fixedly connecting the LED module 3 to the box frame 1.

In an embodiment, the LED module 3 is provided with a second female header 34, and the second female header 34 is electrically connected with the first pin header 122 on the box adapter plate 12.

The above are merely the preferred embodiments of this application, but are not intended to limit the application. Any modification, equivalent substitution and improvement made within the spirit and principle of this application shall be included in the protection scope of this application.

What is claimed is:

1. A box frame, comprising:

a frame border for installing an LED module, wherein the frame border comprises a plurality of connecting seats and a plurality of frames, each connecting seat connects two adjacent frames, the connecting seat and the frame are alternately connected to form a continuous loop structure;

each frame comprises an inner plate, an outer plate, a partition, a first reinforcing structure and a second reinforcing structure, the inner plate and the outer plate are arranged spaced apart in parallel, the partition is connected between the inner plate and the outer plate, so as to divide space between the inner plate and the outer plate into a first groove and a second groove, the first reinforcing structure is arranged in the first groove and the second reinforcing structure is arranged in the second groove;

the partition is vertically connected between the inner plate and the outer plate;

wherein the first reinforcing structure comprises a first connecting plate, a plurality of first reinforcing ribs and a plurality of second reinforcing ribs, the first connecting plate is arranged between the inner plate and the outer plate of the first groove, and the plurality of first reinforcing ribs are arranged between the inner plate and the first connecting plate at intervals, the plurality of second reinforcing ribs are arranged between the outer plate and the first connecting plate at intervals; and the second reinforcing structure comprises a second connecting plate, a plurality of third reinforcing ribs and a plurality of fourth reinforcing ribs, the third connecting plate is arranged between the inner plate and the outer plate of the third groove, and the plurality of third reinforcing ribs are arranged between the inner plate and the second connecting plate at intervals, the plurality of fourth reinforcing ribs are arranged between the outer plate and the second connecting plate at intervals.

2. The box frame of claim 1, wherein the plurality of first reinforcing ribs and the plurality of second reinforcing ribs are staggered, and the plurality of third reinforcing ribs and the fourth reinforcing ribs are staggered.

3. The box frame of claim 1, wherein a plurality of leakage holes are arranged on the partition, the leakage hole communicates the first groove and the second groove, and the leakage hole is arranged between two adjacent first reinforcing ribs and two adjacent second reinforcing ribs.

4. An LED display, comprising the box frame, a power box and a plurality of LED modules of claim 1, wherein the power box is installed at one side of the box frame, and the plurality of LED modules are installed at another side of the box frame.

5. A box frame, comprising:

a frame border for installing an LED module, wherein the frame border comprises a plurality of connecting seats and a plurality of frames, each connecting seat connects two adjacent frames, the connecting seat and the frame are alternately connected to form a continuous loop structure;

each frame comprises an inner plate, an outer plate, a partition, a first reinforcing structure and a second reinforcing structure, the inner plate and the outer plate are arranged spaced apart in parallel, the partition is connected between the inner plate and the outer plate, so as to divide space between the inner plate and the outer plate into a first groove and a second groove, the first reinforcing structure is arranged in the first groove and the second reinforcing structure is arranged in the second groove;

the partition is vertically connected between the inner plate and the outer plate; and wherein the box frame further comprises a box adapter plate, a box sealing plate and a sealing plate connector, the sealing plate connector is connected in the frame border, the sealing plate connector is provided with an accommodation groove for accommodating the box adapter plate, the box sealing plate is connected to the sealing plate connector and encapsulated in the accommodation groove, and the box sealing plate is used for connecting a power box.

6. The box frame of claim 5, wherein the box adapter plate is provided with a first female header and a first pin header, the sealing plate connector is provided with a first insertion hole for the first pin header to pass through, and the first insertion hole is communicated with the accommodation groove, the box sealing plate is provided with a second insertion hole for the first female header to pass through; and the first pin header is used to connect the second female header on the LED module, and the first female header is used to connect the second pin header in the power box, so as to electrically connect the LED module and the power box via the box adapter plate.

7. The box frame of claim 5, wherein the box frame further comprises a horizontal connector and a longitudinal connector, the horizontal connector and the longitudinal connector are cross-connected inside the frame border, so as to divide an interior of the frame border into a plurality of module installation areas, the module installation areas are not communicated with each other and used for installing the LED module.

8. An LED display, comprising the box frame, a power box and a plurality of LED modules of claim 5, wherein the power box is installed at one side of the box frame, and the plurality of LED modules are installed at another side of the box frame.

9. A box frame, comprising:

a frame border for installing an LED module, wherein the frame border comprises a plurality of connecting seats and a plurality of frames, each connecting seat connects two adjacent frames, the connecting seat and the frame are alternately connected to form a continuous loop structure;

each frame comprises an inner plate, an outer plate, a partition, a first reinforcing structure and a second reinforcing structure, the inner plate and the outer plate are arranged spaced apart in parallel, the partition is connected between the inner plate and the outer plate, so as to divide space between the inner plate and the outer plate into a first groove and a second groove, the first reinforcing structure is arranged in the first groove and the second reinforcing structure is arranged in the second groove;

the partition is vertically connected between the inner plate and the outer plate;

wherein each connecting seat comprises a first connecting seat and a second connecting seat, and the first connecting seat is arranged at a corner of the frame border, two adjacent frames connected by the first connecting seat are perpendicular to each other, and two frames connected by the second connecting seat have a same extension direction; and the first connecting seat is provided with a positioning hole configured to position the box frame in a first installation mode using the positioning hole, and the second connecting seat is provided with a mounting hole configured to fixedly connect the box frame in a second installation mode using the mounting hole.

10. An LED display, comprising the box frame, a power box and a plurality of LED modules of claim 9, wherein the power box is installed at one side of the box frame, and the plurality of LED modules are installed at another side of the box frame.

* * * * *